United States Patent [19]

Gray

[11] 4,157,555

[45] Jun. 5, 1979

[54] SUPERCONDUCTING TRANSISTOR

[75] Inventor: Kenneth E. Gray, Naperville, Ill.

[73] Assignee: The United States of America as represented by the United States Department of Energy, Washington, D.C.

[21] Appl. No.: 849,201

[22] Filed: Nov. 7, 1977

[51] Int. Cl.$^2$ ............................................. H01L 49/02
[52] U.S. Cl. .......................................... 357/6; 357/5; 307/306; 307/212
[58] Field of Search .................. 357/6, 5, 4; 307/306, 307/212, 245

[56] References Cited

U.S. PATENT DOCUMENTS

| 3,116,427 | 12/1963 | Giaever | 307/88.5 |
|---|---|---|---|
| 3,155,886 | 11/1964 | Pankove | 317/235 |
| 3,204,115 | 8/1965 | Parmenter | 307/88.5 |
| 3,275,095 | 9/1966 | Pollack | 317/234 |
| 3,372,315 | 3/1968 | Hartman | 317/235 |
| 3,447,043 | 5/1969 | Wallace | 317/234 |

*Primary Examiner*—Martin H. Edlow
*Attorney, Agent, or Firm*—Dean E. Carlson; Frank H. Jackson; Donald R. Reynolds

[57] ABSTRACT

A superconducting transistor is formed by disposing three thin films of superconducting material in a planar parallel arrangement and insulating the films from each other by layers of insulating oxides to form two tunnel junctions. One junction is biased above twice the superconducting energy gap and the other is biased at less than twice the superconducting energy gap. Injection of quasiparticles into the center film by one junction provides a current gain in the second junction.

10 Claims, 8 Drawing Figures

SUPERCONDUCTING TRANSISTOR

CONTRACTUAL ORIGIN OF THE INVENTION

The invention described herein was made in the course of, or under, a contract with the U.S. DEPARTMENT OF ENERGY.

BACKGROUND OF THE INVENTION

This invention relates to thin-film superconducting junction devices.

The semiconductor junction has been exploited to produce a wide variety of devices including junction diodes, junction transistors and many others. In particular, the semiconductor junction transistor is formed by disposing in linear sequence three sections of semiconductor material that are doped to produce sequentially alternating majority carriers and that are separated by depletion layers thin by comparison with the characteristic distances for diffusion of minority carriers. In such semiconducting devices the possibility of varying dopants so that majority carriers may be either electrons or holes produces the possibility of making rectifying junctions. However, such rectification is not related inherently to transistor action, which is here defined as the production by injection into a junction of an effect that is greater in magnitude than the magnitude of the injection. In a semiconducting junction the injection is of minority carriers into the base. Thus, electrons are injected into a base formed of P material, which is material formed by doping a valence-4 semiconductor with a valence-3 dopant. Correspondingly, holes are injected into a N material which is a valence-4 semiconductor doped with a valence-5 material.

The mechanism of conduction is different in superconductors. Superconduction has been explained successfully as the collective action of paired electrons (Cooper pairs) in a single quantum state below a critical temperature. There is no equivalent to the doping of semiconductors, and no structure that exhibits a preferential direction of conduction like the junction transistor. However, there are two phenomena that can be exploited to provide transistor action in a superconducting device. One of these is the tunneling of unpaired electrons (quasiparticles) through thin insulating layers. The other is the possibility of injecting quasiparticles into a superconducting region by superconducting tunneling.

It is an object of the present invention to produce transistor action with a superconducting device.

It is a further object of the present invention to produce a measured current gain in a device made of thin films of superconductors.

Other objects will become apparent in the course of a detailed description of the invention.

SUMMARY OF THE INVENTION

A device is formed by disposing three substantially parallel, thin-film superconductors in close association, separated by thin insulating layers to form two junctions. When the junction having higher specific resistance is biased above twice the voltage corresponding to the superconducting energy gap and the junction having lower specific resistance is biased at less the voltage corresponding to twice the superconducting energy gap, the result is a change in the total current flow through one junction that is greater than the amount of current injected into the middle superconducting layer.

DETAILED DESCRIPTION OF THE PREFERRED EMBODIMENT

Figure 1:
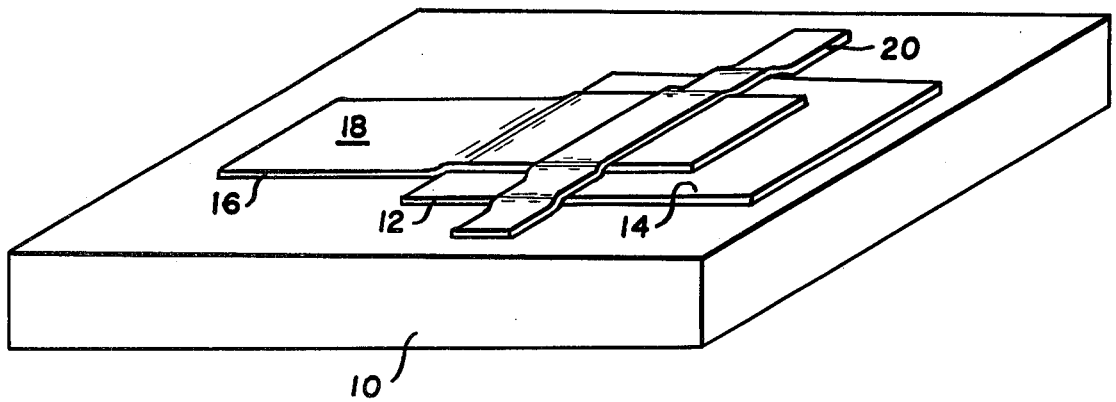
FIG. 1 is a partial sectional view of an apparatus for the practice of the present invention.

FIG. 1 is a partial sectional view of an apparatus with the practice of the present invention. In FIG. 1 substrate 10 is made of a material such as sapphire that will stand the process of vapor deposition and maintain on an electrically insulating surface the relative positions of vapor-deposited substances. First film 12 is a vapor-deposited film of a material that is superconducting in an appropriate temperature range. First film 12 is deposited in a desired location by the use of masks to control deposition. First insulating layer 14 is formed on first film 12 by means such as oxidation to a thickness appropriate for tunneling. Second film 16 is then formed to cover a portion of first film 12 and first insulating layer 14 and form a tunneling junction therewith. Second film 16 is then oxidized or otherwise treated to form a thin insulating layer 18 having a thickness of the order of a tunneling distance. Third film 20 is then deposited through a mask in a region that forms a sandwich structure with first film 12, second film 16 and the insulating layers between them and third film 20. As shown in FIG. 1, the masking is carried out so that there is a junction between first film 12 and second film 16 and a junction between second film 16 and third film 20, but there is no junction between first film 12 and third film 20.

Figure 2A:
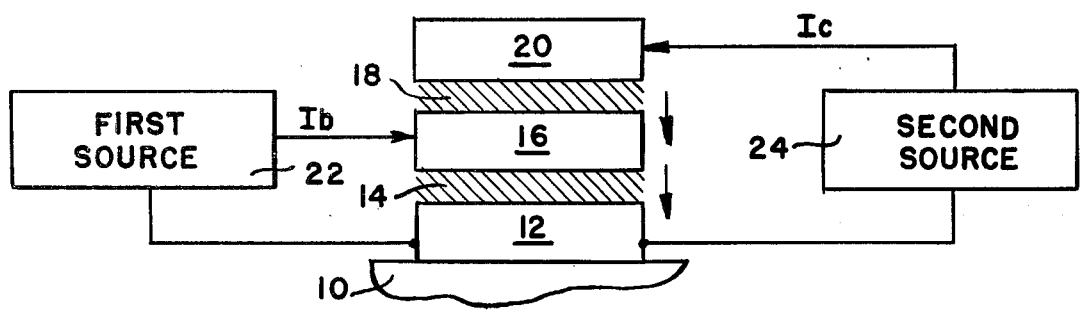
FIG. 2a is an idealized sectional view of an apparatus for the practice of the present invention showing external circuit connections.
Figure 2B:
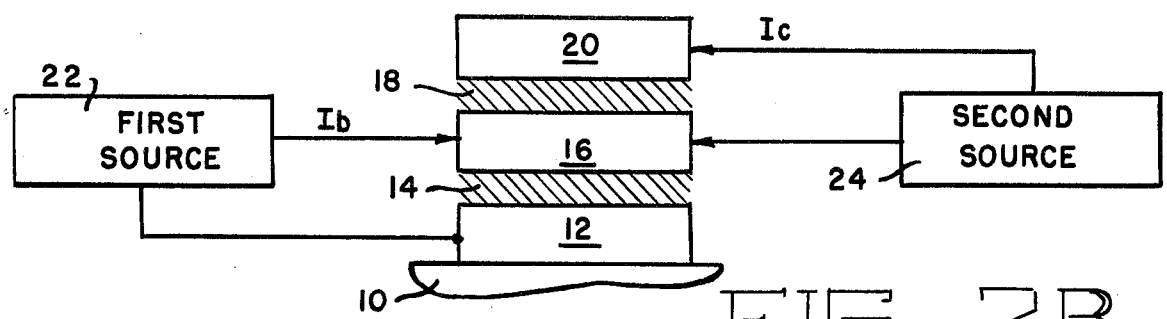
FIG. 2b is an idealized sectional view with alternative external connections.

The structure and its operation are made apparent in FIGS. 2a and 2b, which are schematic views of a sandwich combination of junctions and their electrical connections. In FIGS. 2a and 2b first film 12 is deposited on substrate 10 and forms with second film 16 a tunneling junction separated by first insulating layer 14. Similarly, second film 16 is separated from third film 20 by second insulating layer 18 to form a second tunneling junction. FIGS. 2a and 2b differ only in biasing connections. The structure of FIG. 2a is placed in an operating condition by connecting a first source 22 between first film 12 and second film 16 to inject a current $I_b$ into second film 16. A second source 24 is connected between first film 12 and third film 20 to deliver a collector current $I_c$. In FIG. 2b, second source 24 is connected between second film 16 and third film 20. The current from second source 24 is indicated in FIG. 2 and consists of I(0), the quiescent current bias which makes the collector operational, and ΔI which varies with current injected into second film 16. It is evident that, if a change in current $I_b$ produces a greater change in current $I_c$ then the device has achieved a current gain and has possibilities of use as an amplifier. That condition can be achieved in a fashion that is indicated in FIGS. 3 and 4.

Figure 3:
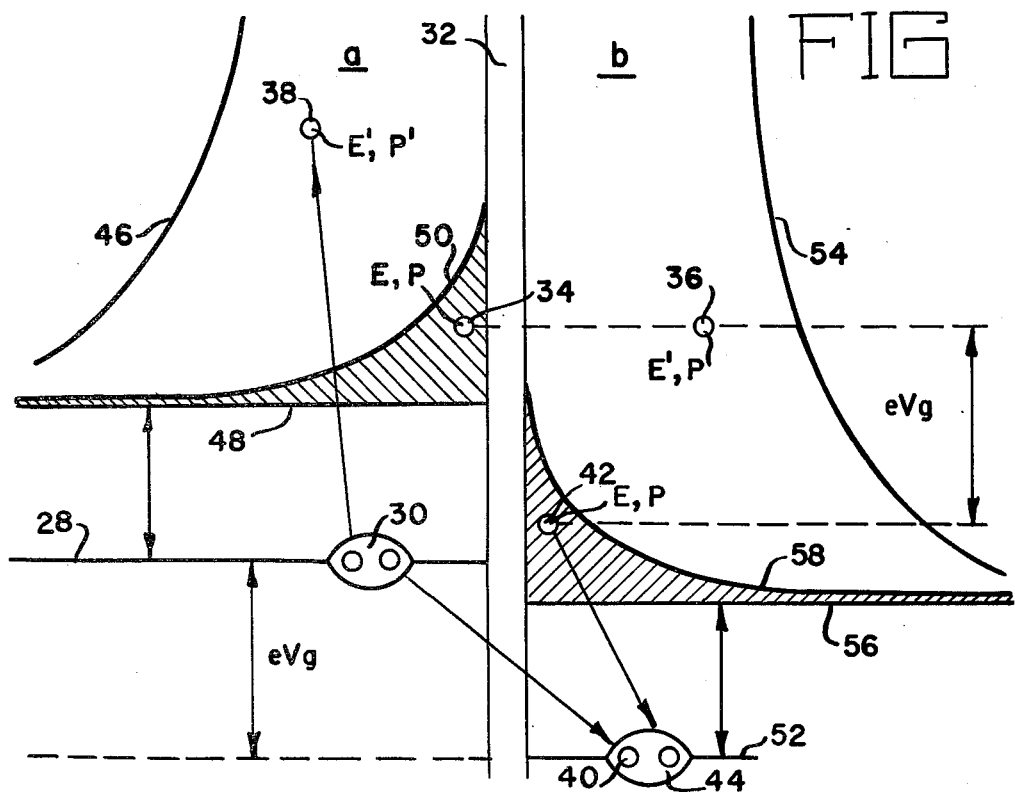
FIG. 3 is a schematic diagram of the energy levels showing the tunneling processes in a junction biased at less than twice the energy gap.
Figure 4:
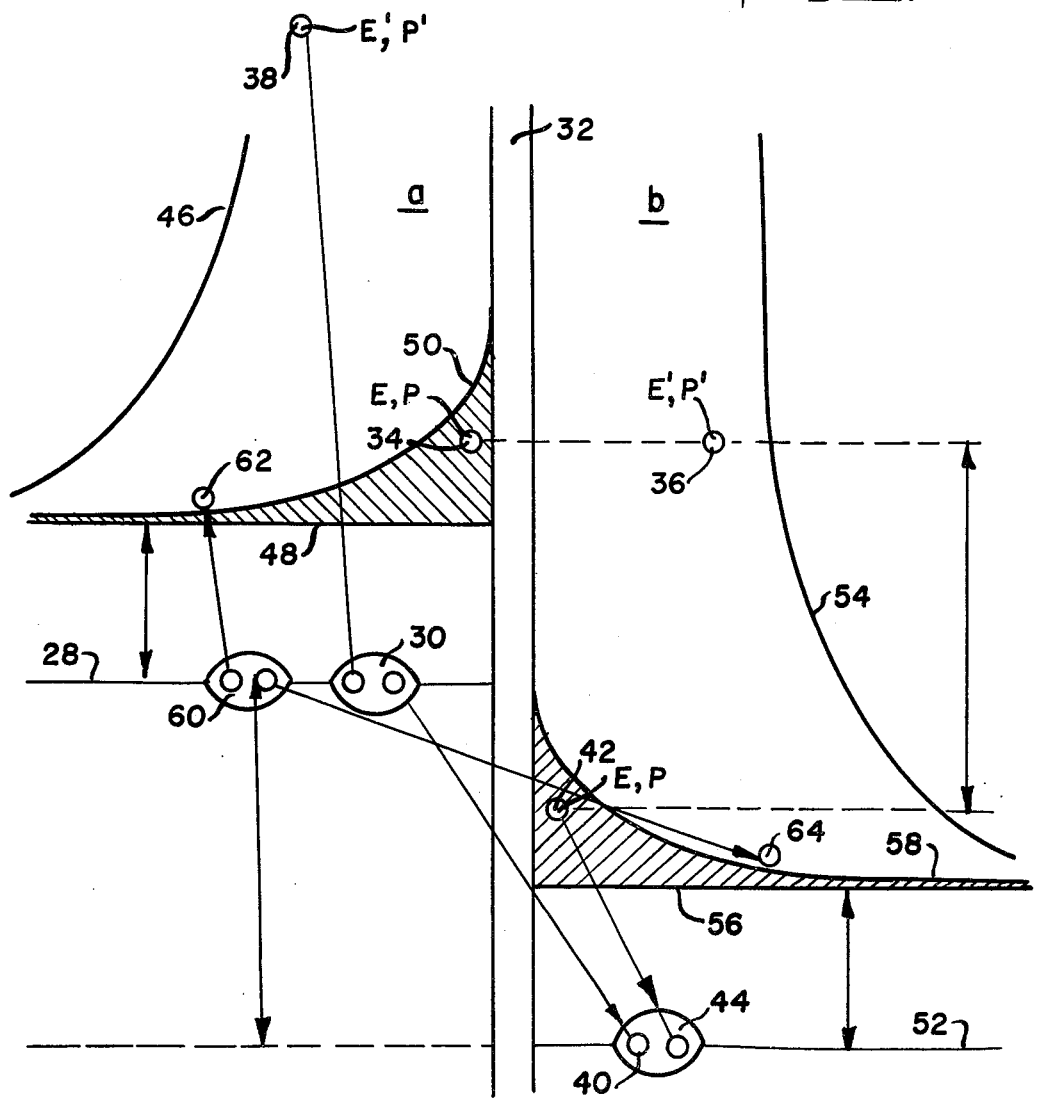
FIG. 4 is a schematic diagram of the energy levels showing the tunneling process in a junction biased at more than twice the energy gap.

FIGS. 3 and 4 are referred to conventionally as energy-level diagrams which also show the tunneling processes possible. FIG. 3 is an energy-level diagram at an insulating junction between two superconductors that are biased by a voltage $V_g$ that is less than twice the voltage associated with the energy gap of the superconductor. This represents an energy difference of $eV_g$, where e is the electric charge. FIG. 4 is an energy-level diagram for a junction of two superconductors that are biased with respect to each other by a voltage $V_g$ that is greater than twice the voltage associated with the superconducting energy gap. In addition to the energy levels that are indicated in FIGS. 3 and 4, curves are plotted with abscissas that indicate the reduced Bardeen-Cooper-Schrieffer (BCS) density of states as functions of energy as the ordinate. The abscissa in another curve indicated in FIGS. 3 and 4 is the product of the reduced BCS density of states multiplied by the Fermi function, which is the probability of occupation of a state of the associated energy at a given temperature. The ordinate in each of these curves is energy and the curves are each referred to a common energy level to permit a comparison of the effects of an applied voltage on the junctions.

FIG. 3 represents a mechanism of conduction when a thin insulating film creates a junction between two thin-film superconductors, which junction is biased at a voltage less than twice the voltage associated with the energy gap in the superconductors. In FIG. 3, energy level 28 represents the ground state in the superconducting material described by the curves in region a. The phenomenon of superconductivity is explained by the existence of electrons in the superconducting material in the form of Cooper pairs, one of which is indicated symbolically as pair 30 in FIG. 3. All Cooper pairs are at the same energy level. Conduction across insulating junction 32 occurs by two mechanisms that are illustrated in FIG. 3. The first of these is quasiparticle tunneling. A quasiparticle in a superconductor is an unpaired charged particle made up of many unpaired electron states. Quasiparticle 34 is indicated in FIG. 3 as tunneling through junction 32 and appearing across junction 32 as quasiparticle 36. The tunneling is indicated horizontally in the energy level diagram because there must be energy conservation between the initial and final states in quasiparticle tunneling. The mechanism just described takes place in numbers that are identical to those of the second mechanism, which is the breaking of Cooper pairs such as pair 30 into one quasiparticle 38 that remains in region a and an electron 40 that tunnels to region b and forms a new pair 44 with a quasiparticle 42. While the actual mechanism has been that of the tunneling of an electron across junction 32, from a to b, because of the interaction with pairs it seems as if quasiparticle 42 has tunneled into film a as quasiparticle 38. It should be noted that the conservation of energy requires that the vertical distances traveled downward by quasiparticle 42 and quasiparticle 40 are equal to the vertical rise in energy level of quasiparticle 38.

FIG. 3 can be clarified by noting the following features that are conventionally represented in such diagrams. Curve 46 is a plot of the density of states as a function of energy having an abscissa that is positive to the left. Curve 46 is asymptotic to line 48 which is at an energy level equal to the amount of the superconducting energy gap Δ above the ground state that is represented by level 28. The curve 50 represents the product of curve 46 with the Fermi factor which is the probability of occupation of those states at a given temperature. Each of the foregoing curves defined for region a has a counterpart in region b that is shifted by an energy equivalent to the voltage applied across the junction 32. Thus, in region b, level 52 represents the ground state state in region b. Level 52 is below level 28 by an energy $eV_g$ which is the energy equivalent of the applied voltage. Curve 54 is the equivalent in region b of curve 46 in region a: it is the curve of the density of states as a function of energy with the abscissa increasing away from junction 32. Curve 54 is asymptotic to line 56 which is at an energy equal to the energy gap above level 52. Curve 58 is the product of the energy levels in region b times the probability of occupation of each of the states. The currents through the junction corresponding to both of these processes are equal in magnitude and are proportional to the number density of quasiparticles which is indicated by the shaded regions in FIG. 3.

FIG. 4 is an energy diagram that differs from the diagram of FIG. 3 in that in FIG. 4 the superconducting regions are biased by a voltage that is greater than twice the energy level. Corresponding elements in FIG. 4 are numbered like those in FIG. 3 so that level 28 is the base energy level in region a. As in FIG. 3, pair 30 is split into a quasiparticles 30 and an electron 40 which tunnels to form a pair 44 in region b. As before, curves 46 and 30 54 represent the densities of states in regions a and b, respectively. As in FIG. 3, quasiparticle 34 tunnels through junction 32 to appear in region b as a quasiparticle 36. However, because the energy level 28 of the Cooper pairs in region a is biased to be more than twice the superconducting energy gap above level 52 of curve b, a new mechanism for conduction is introduced. This is the splitting of a Cooper pair 60 into a quasiparticle 62 that remains in region a and an electron that funds to form quasiparticle 64 in region b. Inspection of FIG. 4 shows that this condition is allowed because the bias exceeds twice the superconducting energy gap Δ. Thus, when pair 60 is split, quasiparticle 62 can increase in energy an amount that places it above line 48 in region a and hence places the quasiparticle in an allowed state. States between lines 28 and 48 are not allowed. The vertical drop in position between the energy of Cooper pair 60 and quasiparticle 64, which must be equal in magnitude to permit conservation of energy, allows quasiparticle 64 to exist in region b, since the drop in energy is to a location that is not within the superconducting energy gap represented in region b by the distance between level 52 and line 56. It is the breaking of Cooper pairs such as pair 60 and the quasiparticle tunneling represented by the appearance in region b of quasiparticle 64 that leads to the possibility of transistor action in a properly biased device. One junction biased at a voltage more than twice the voltage corresponding to the superconducting energy gap breaks Cooper pairs and injects quasiparticles into a middle film. A second junction using the middle film is biased independently of the bias on the first junction and is placed at a voltage corresponding to an energy less than twice the superconducting energy gap. Thus, the current in the second junction is proportional to the density of quasiparticles. If the change in current through the second junction can be observed to be greater than the injected current, needed to produce that change, then the device is exhibiting an a-c current gain.

Figure 5:
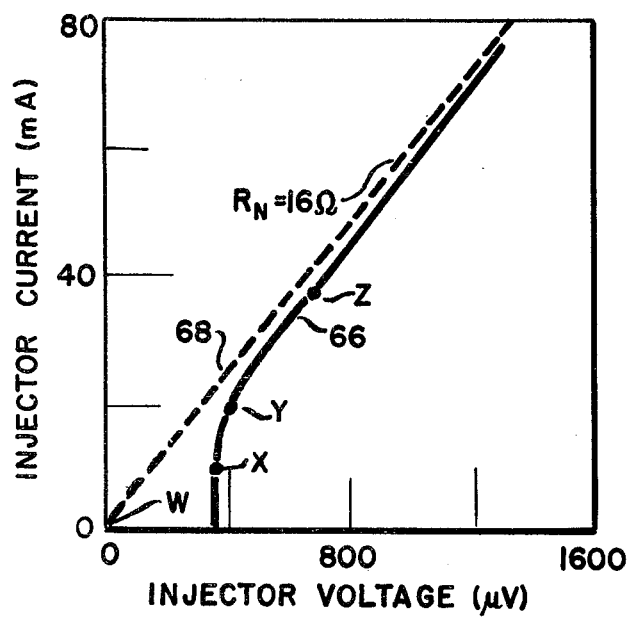
FIG. 5 is a plot of current versus voltage for the injector junction of a typical superconducting transistor.
Figure 6:
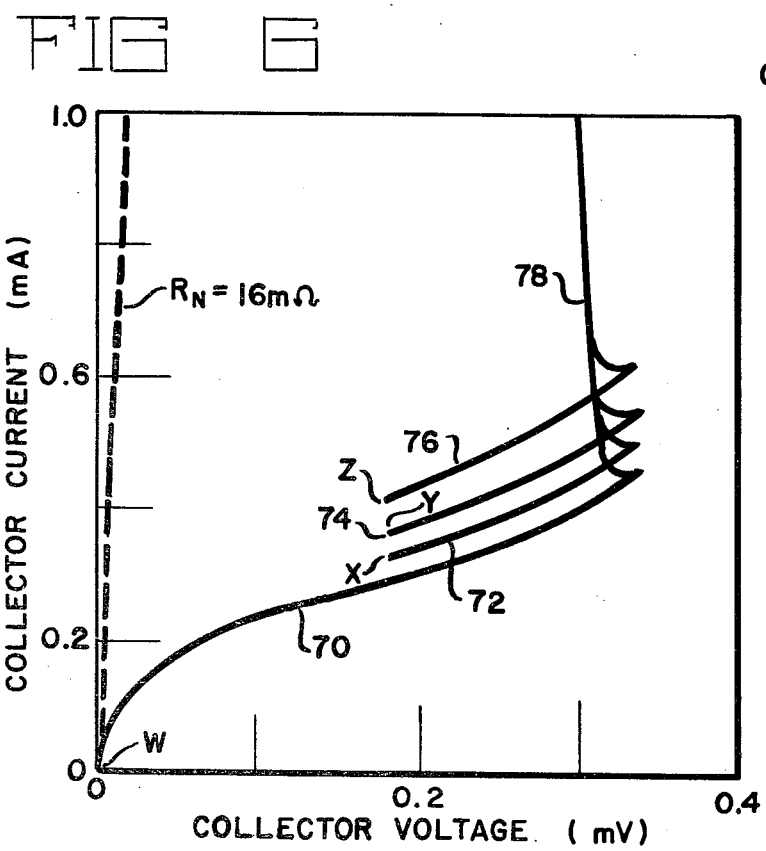
FIG. 6 is a plot of current versus voltage in the collector junction of the superconducting transistor for various values of the injector current.
Figure 7:
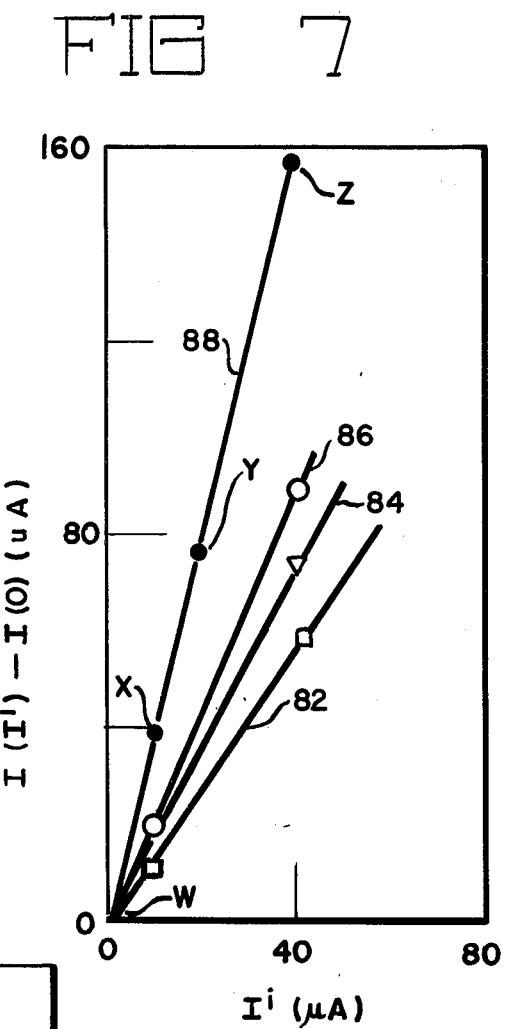
FIG. 7 is a plot of collector current as a function of injector current for a superconducting transistor.

Experimental results obtained on an actual device constructed according to the principles of the present invention are shown in FIGS. 5, 6 and 7. FIG. 5 is a plot of injector current as a function of injector voltage for a superconducting transistor embodying the principles of the present invention. FIG. 6 is a plot of collector current as a function of collector voltage for the same transistor for various values of injector current. FIG. 7 is a plot of the change in collector current as a function of injector current for various values of temperature. FIGS. 5, 6 and 7 are described together so that certain features common to the curves may be noted.

The curve of FIG. 5 begins at the origin at a point marked "w". Injector current remains at zero while injector voltage is increased to a value of approximately 375 microvolts. At this point, injector current begins a rise that is nearly vertical through point "x" and bending through points "y" and "z" as the curve makes an asymptotic approach to the dashed line that represents the junction resistance. Points w, x, y and z are marked on FIG. 5 because they have a correspondence in FIG. 6 which is now noted. FIG. 6 is a plot of collector current as a function of collector voltage for the various fixed values of injector current that were marked on FIG. 5 and are identified on FIG. 6 by the same letters w, x, y and z, associated respectively with lines 70, 72, 74 and 76. All merge into line 78. In the region of FIG. 6 between collector voltages of about 0.2 to 0.3 mV, it can be seen that change in the injector current among the values represented by points w, x, y and z causes a corresponding shift in the curves of FIG. 6 among the curves marked by the letters w, x, y and z. Thus, a variation in the injector current causes a transition from one curve of the collector current-voltage characteristic to another such curve. The variation of one set of values as a function of a parameter thus presents the possibility of gain. The certainty of that gain appears from an inspection of FIG. 7 which is a set of current-transfer characteristics of the transistor of the present invention for various values of temperature. In FIG. 7, line 82 was obtained for a given temperature that is below the critical temperature of the superconductor and lines 84, 86 and 88 were obtained for increasingly lower temperatures, also below the critical temperature. Line 88 is the current-transfer characteristic of the transistor shown in FIGS. 5 and 6 at the operating temperature at which the curves of FIGS. 5 and 6 were obtained. The current scales on the ordinate and abscissa of FIG. 7 are identical so that it follows that any curve on the scales of FIG. 7 that has a slope greater than unity represents a current gain greater than 1. That fact exists by inspection in FIG. 7. Lines 82, 84, 86 and 88 all have slopes greater than 1 with the slopes increasing successively from line 82 to line 88.

The physical effect that is associated with current gain in the device of the present invention is believed to be the following. An electron injected into the middle film creates a quasiparticle excitation which causes more than one electron to flow across the collector junction. The injected particle can cross the collector barrier many times, and each time an electronic charge is transferred in the same direction through the collector junction to constitute a current. The quasiparticle is created by injection and is free to tunnel back and forth until it is recombined in the collector junction to form a Cooper pair. If the tunneling rate exceeds the recombination rate, then there is a possibility of current gain.

The curves of the preceding figures were obtained at the Argonne National Laboratory on a device that was formed by depositing a film of aluminum to a thickness of the order of 30 nanometers on a sapphire substrate. This film was oxidized to a relatively low value of resistance, of the order of 16 milliohms, to form the collector junction. This corresponds to a specific resistance of about 6 microhms-square centimeters. A second aluminum film, also of the order of 30 nanometers thick, was deposited over the insulating film to form the collector junction. This film was then oxidized to a relatively high resistance, of the order of 16 ohms, thus forming the injector junction. The oxide was enough thicker to exhibit a specific resistance of about 6 milliohms-square centimeters. The third thin film of aluminum was vapor-deposited to a thickness of the order of 30 nanometers to produce a structure similar to that of FIG. 1. The relatively low-resistance collector junction was biased at a voltage less than twice the voltage corresponding to the superconducting energy gap. The injector junction, having the higher resistance, was biased above a voltage corresponding to twice the superconducting energy gap. The curves of FIGS. 5 and 6 were obtained with the apparatus at a temperature of approximately 0.62° K. as was line 88 in FIG. 7. Lines 82, 84 and 86 represent curves obtained at successively higher temperatures that were below the critical temperature of aluminum.

The embodiments of the invention in which an exclusive property or privilege is claimed are defined as follows:

1. A superconducting transistor comprising:
   a first tunneling junction having a predetermined resistance per unit area to form a collector junction;
   a thin film of superconducting material disposed in contact with the first junction;
   a second tunneling junction having a resistance per unit area that is high with respect to the resistance per unit area of the first tunneling junction to form an injector junction, the second tunneling junction disposed in contact with the thin film of superconducting material to form therewith a sandwich structure.

2. The apparatus of claim 1 comprising in addition:
   a first bias source connected electrically to the first tunneling junction to establish across the first tunneling junction a bias voltage that is less than twice the voltage corresponding to the superconducting energy gap of the thin film of superconducting material; and
   a second bias source connected electrically to the second tunneling junction to establish across the second tunneling junction a bias voltage that is greater than twice the voltage corresponding to the superconducting energy gap of the thin film of superconducting material.

3. The apparatus of claim 2 comprising in addition:

means for injecting a signal current into the second tunneling junction, which signal current is amplified in the first junction.

4. The apparatus of claim 2 wherein the first tunneling junction has specific electrical resistance of about 6 microhms-square centimeters.

5. The apparatus of claim 4 wherein the second tunneling junction has a specific electrical resistance of about 6 milliohms-square centimeters.

6. An apparatus for current amplification comprising:
an insulating substrate;
a first thin superconducting film deposited on the substrate;
a first insulating layer deposited on the first film to produce a predetermined resistance per unit area;
a second thin superconducting film deposited on the first insulating layer in a predetermined pattern to produce with the first insulating layer and the first thin superconducting layer a collector junction;
a second insulating layer deposited on the second thin superconducting film to produce a resistance per unit area that is higher than the resistance per unit area of the first insulating layer; and
a third thin superconducting film deposited on the second insulating layer in a predetermined pattern to produce with the second insulating layer and the second thin superconducting film an injector junction, the predetermined pattern of the third thin superconducting film selected to prevent a junction with the first thin superconducting film.

7. The apparatus of claim 6 wherein the insulating substrate is sapphire.

8. The apparatus of claim 7 wherein the first thin superconducting film is aluminum deposited on the sapphire, and wherein the first insulating layer is aluminum oxide produced by oxidizing the aluminum to a specific resistance of about 6 microhm-square centimeters.

9. The apparatus of claim 8 wherein the second and third thin superconducting films are deposited aluminum and wherein the second insulating layer is aluminum oxide producted by oxidizing the second thin superconducting film to a specific resistance of about 6 milliohm-square centimeters.

10. The apparatus of claim 9 comprising in addition:
collector junction bias means connected electrically to the collector junction to establish across the collector junction a bias voltage that is less than twice the voltage corresponding to the superconducting energy gap of aluminum; and
injector junction bias means connected electrically to the injector junction to establish across the injector junction a bias voltage that is more than twice the voltage corresponding to the superconducting energy gap of aluminum.

* * * * *